United States Patent
Pfaff et al.

(10) Patent No.: US 6,861,138 B1
(45) Date of Patent: Mar. 1, 2005

(54) ELECTRICALLY CONDUCTIVE, THERMOPLASTIC, HEAT-ACTIVATED ADHESIVE FILM

(75) Inventors: Ronald Pfaff, Hamburg (DE); Hans Karl Engeldinger, Quickborn (DE)

(73) Assignee: tesa AG, Hamburg (DE)

( * ) Notice: Subject to any disclaimer, the term of this patent is extended or adjusted under 35 U.S.C. 154(b) by 0 days.

(21) Appl. No.: 09/720,947

(22) PCT Filed: Jul. 1, 1999

(86) PCT No.: PCT/EP99/04539

§ 371 (c)(1),
(2), (4) Date: Jan. 3, 2001

(87) PCT Pub. No.: WO00/01782

PCT Pub. Date: Jan. 13, 2000

(30) Foreign Application Priority Data

| Jul. 4, 1998 | (DE) | 198 30 021 |
| Mar. 20, 1999 | (DE) | 199 12 628 |

(51) Int. Cl.$^7$ .............. C09J 7/02; H01R 4/04; H01L 21/60
(52) U.S. Cl. ........... 428/343; 428/346; 428/355 EP; 428/355 EN; 428/355 N; 428/356; 428/403; 428/406
(58) Field of Search ............ 428/343, 346, 428/355 EP, 355 EN, 355 CN, 355 N, 356, 402, 403, 406

(56) References Cited

FOREIGN PATENT DOCUMENTS

| DE | 19519499 A1 | * 11/1996 |
| EP | 0 134 623 | 3/1985 |
| EP | 0 140 619 | 5/1985 |
| EP | 0 846 743 | 6/1998 |
| JP | 08 111426 | 8/1996 |
| WO | WO 98 03047 | 1/1998 |

OTHER PUBLICATIONS

EP 846743A1 Pat Abst, Jun. 1998.*
DE 19519499A1 Pat Abst, Nov. 1996.*

* cited by examiner

*Primary Examiner*—Daniel Zirker
(74) *Attorney, Agent, or Firm*—Norris McLaughlin & Marcus PA

(57) ABSTRACT

Electrically conductive, thermoplastic and heat-activatable adhesive film, comprising
i) a thermoplastic polymer in a proportion of from 30 to 89.9% by weight,
ii) one or more tackifying resins in a proportion of from 5 to 50% by weight and/or
iii) epoxy resins with hardeners, with or without accelerators, in a proportion of from 5 to 40% by weight, and
iv) silver-coated glass beads or silver particles in a proportion of from 0.1 to 40% by weight.

11 Claims, No Drawings

ELECTRICALLY CONDUCTIVE, THERMOPLASTIC, HEAT-ACTIVATED ADHESIVE FILM

The invention describes an electrically conductive, thermoplastic and heat-activatable adhesive film as used for the permanent connection of two articles.

Electronic components are becoming ever smaller, which makes their handling and processing ever more difficult. Especially when producing electrical contacts between the components and/or the connections, it is found that conventional soldering can no longer provide simple and cost-effective connection of the corresponding contacts.

The adhesive bonding of electronic components by means of electrically conductive adhesive films is therefore being developed as an alternative.

For the field of electrically conductive adhesive tapes, it is prior art to employ conductive pigments such carbon black, metal powders, ionic compounds and the like in adhesive compositions.
In sufficient quantities, the particles contact one another and the possibility of current flow from particle to particle is provided. The current flow here is not directionally oriented (isotropic); for specific applications, such as electronic switches, contacting of conductors, etc., there is, however, the requirement to achieve electrical conductivity only in the depth direction (z direction) through the adhesive tape, with no conductivity, however, in the two-dimensional extent (x-y plane) of the adhesive film.

In special cases, it is also required/must be ensured that the conductive sites through the adhesive film (in the z direction)

- are distributed homogeneously, so that any sites on the adhesive tape can be used identically and lead to the same results;
- have small cross sections, so that even in the electronics sector conductor tracks lying close together can be selectively connected without the risk of short circuits, and
- are insulated from one another, in that the areas in between are not filled with conductive materials.

The U.S. Pat. No. 3,475,213 describes randomly distributed spherical particles which consist entirely of a conductive metal or are provided with an electrically conductive layer. The best results are achieved with particles which are only slightly smaller than the thickness of the film of adhesive composition.

In U.S. Pat. No. 5,300,340, a special production method using a rotating drum is employed to site the electrically conductive particles in the adhesive composition.

Both of the pressure-sensitive adhesive (PSA) tapes described are based on self-adhesive acrylate polymer compositions and are unable to connect two substrates with the strength required for a permanent bond. Connections subject to permanent or repeated stress, such as by tensile, torsional or shear forces, for example, exhibit signs of detachment after just a short time. The reason for this is that, in the cited prior art, the generally low bond strength of the PSA tapes is reduced further by the addition of electrically conducting particles. The joining techniques are therefore inadequate for ensuring a permanent bond in the case of electronic contacts which are subject to mechanical stress.

The particles that are added firstly reduce the bond strength and secondly increase the distance from the adhesive tape to the surface, since the particles project from the surface to a certain extent, which is entirely desirable for improving the electrical conductivity.

In the case of a product structure as described by U.S. Pat. No. 5,300,340, this feature is deliberately exploited by mixing in relatively large particles having a diameter which is greater than the thickness of the adhesive composition.

Not only do the processes presented above display inadequate bond strengths for electrical contacts subject to mechanical stress, the bonds produced with them can also be parted again, as a result of which manipulations are possible and property rights, especially in the case of sensitive electronic components, can easily be infringed.
Particularly in the case of electronic devices which are small and flexible and are used in an electronic toy or in chip cards, the electrically conducting adhesive bond is frequently not protected by a rigid housing, is required to withstand flexural stresses without loosing the electrical contact, and is susceptible to such manipulation.

The object of the invention is to achieve an effective and permanent bond while simultaneously producing an electrically conductive contact in the case where a carrier element in data carriers or electronic components is bonded with the aid of a heat-activatable adhesive film.

This object is achieved by means of an adhesive film as characterized further in the main claim. The subclaims relate to advantageous developments of the subject matter of the invention, In accordance with the invention, the electrically conductive, thermoplastic and heat-activatable adhesive film comprises i) a thermoplastic polymer in a proportion of from 30 to 89.9% by weight, ii) one or more tackifying resins in a proportion of from 5 to 50% by weight and/or iii) epoxy resins with hardeners, with or without accelerators, in a proportion of from 5 to 40% by weight, and iv) silver-coated glass beads or silver particles in a proportion of from 0.1% by weight, very preferably 10% by weight, to 40% by weight.

The adhesive film is a mixture of reactive resins, which crosslink at room temperature and form a three-dimensional polymer network of high strength, and permanently elastic elastomers, which act against embrittlement of the product. The elastomer may preferably be from the group consisting of polyolefins, polyesters, polyurethanes and polyamides or can be a modified rubber, such as nitrile rubber, for example.

The particularly preferred thermoplastic polyurethanes (TPUs) are known reaction products of polyester polyols or polyether polyols and organic diisocyanates such as diphenylmethane diisocyanate. They are composed of predominantly linear macromolecules. Such products are generally obtainable commercially in the form of elastic granules—for example, from Bayer AG under the trade name "Desmocoll".

By combining TPU with selected compatible resins, it is possible to achieve a sufficient reduction in the softening point of the adhesive film, so as to prevent deformation of the card body during the production process. In parallel with this, there is, in fact, an increase in the adhesion. Examples of resins which have been found suitable are certain rosins, hydrocarbon resins and coumarone resins.

Alternatively, the reduction in the softening temperature of the adhesive film can be achieved by combining TPU with selected epoxy resins based on bisphenol A and/or F and a latent hardener. An adhesive film comprising such a system permits aftercuring of the joint, either gradually at room temperature without any further external intervention, or briefly by controlled heat treatment of the cards following production. In this way, it is possible to prevent subsequently non-destructive removal of the chips with criminal intent using, for example, a standard iron.

The chemical crosslinking reaction of the resins brings about high strengths between the adhesive film and the surface to the bonded and achieves a high internal strength in the product.

The addition of these reactive resin/hardener systems also leads to a reduction in the softening temperature of the abovementioned polymers, which has the advantageous effect of reducing their processing temperature and processing rate. The suitable product is a product which is self-adhesive at room temperature or slightly elevated temperatures. When the product is heated, there is a short term reduction in the viscosity, as a result of which the product is able to wet rough surfaces as well.

The beads present in the adhesive film permit conductivity only in the z direction; in the x-y plane, owing to the lack of mutual contact, there is not conductivity.

The compositions for the adhesive film can be varied widely by altering the nature and proportion of the raw materials. Similarly, it is possible to obtain further product properties, such as colour, thermal conductivity or electrical conductivity, for example, by targeted additions of colorants, mineral and/or organic fillers, and/or powders of carbon and/or metal.

The adhesive film preferably has a thickness of from 20 to 500 $\mu$m.

The silver particles may consist of pure silver or else may be produced from an alloy, which in that case should contain a considerable proportion of silver in order to ensure conductivity.

References below to (silver-coated) glass beads will be understood by the person skilled in the art as embracing the abovementioned silver particles.

In a first, advantageous embodiment of the invention, the diameter of the silver-coated glass beads is at least equal to the thickness of the adhesive film and may even be somewhat greater than the thickness of the adhesive film to be produced.

In an alternative, advantageous embodiment of the adhesive film, the diameter of the glass beads is between 10 and 20 $\mu$m smaller than the thickness of the adhesive film.

Which diameter of the glass beads is chosen in accordance with the invention depends on the particular intended use of the adhesive film.

If the diameter of the glass beads is greater than the adhesive-film thickness, glass beads projecting from the adhesive film may lead to unwanted air inclusions in the joint, which may reduce the bond strength. Under adverse conditions, this may result in the glass beads in an elastic joint losing contact under mechanical stresses, which can be reestablished only by repeating the pressing operation.

In the case of some applications, therefore, the bond strength is more important than the conductivity. In these cases, bonding must be conducted at high pressure and at elevated pressure. In this specific case, it is possible to omit electrically conductive glass beads projecting from the adhesive film.

The conductive glass beads in this case can be about 10 to 20 $\mu$m smaller than the thickness of the adhesive film, so permitting easy attachment and full-area bonding without air inclusions.

Despite this, electrical contact is produced, since under these bonding conditions the viscosity of the adhesive composition is reduced so severely that it is displaced and the thickness of the joint is reduced. This takes place, for example, when adhesively bonding modules in smart cards. In this case, a pressure of 60 N per module and a die temperature of about 200° C. are chosen. Under these conditions, the conductive glass beads receive an electrically conductive contact, since the adhesive composition is displaced and is able to escape into a cavity below the chip module.

This is important, for example, when implanting a module in a card having an antenna in the card body.

The adhesive film of the invention can be employed with particular advantage to implant electrical modules into a card body which is provided with a cutout which is intended to accommodate an electronic module having a plurality of contact surfaces on the first side and having on the second side, which is opposite to the first side, an IC chip whose terminals are connected via electrical conductors to the contact surfaces, the adhesive film being used to connect the second side of the module to the card body.

Preferably, in this case, the adhesive film has the same dimensions as the module and is in the form of a punched film section.

Furthermore, it is also possible to use the adhesive film for structural bonding, with or without subsequent heat-curing.

The invention describes an electrically conductive, thermoplastic and heat-activatable adhesive film as used for the permanent connection of two articles. In contrast to adhesive bonds produced with a PSA tape, strengths as required in the construction sector are permanently achieved and are retained even under chemical, thermal or climatic stress.

To produce the adhesive film, the composition forming the film is cast as a solution onto a flexible substrate (release film or release paper) and is dried, so that the composition can easily be removed again from the substrate.

Following appropriate processing, punched sections or rolls of this adhesive film can be bonded to the adherend substrate (electronic component, module, etc.) at room temperature or at slightly elevated temperature.

The admixed reactive resins should not enter into any chemical reaction even at the slightly elevated temperature. Therefore, the bonding operation need not be carried out as a one-stage process; rather, for the sake of simplicity, it is possible, as with a PSA tape, first to attach the adhesive film to one of the two substrates by lamination at the elevated temperature. Then, in the actual process of hot bonding to the second substrate, the resin cures partly or fully and the bonded joint attains the high bond strength, far above that of PSA systems.

Accordingly, the adhesive film is particularly suitable for hot pressing at temperatures below 120° C., in particular from 80 to 100° C.

In contrast to adhesive pastes or liquid adhesives comprising conductive filler, which are usually suitable only for isotropically conductive connection, however, the adhesive film described does not cure to a brittle film, but instead, owing to the balanced proportion of crosslinker resin and elastic rubber, remains in a viscoelastic state, as a result of which it is able effectively to withstand peel movement and peel stresses in particular. The great advantage of the adhesive film described comes to bear wherever an adhesive bond or fastening and an electrically conductive connection have hitherto been carried out in two separate steps. In the great majority of cases, this also means an increase in the space required for fastening and conductive connection, which in the case of relatively small electronic components is a disadvantage. Furthermore, the separate bonding step requires special equipment and expensive machinery.

The adhesive films of the invention are therefore distinguished by a number of advantages:

They possess high cohesion and elasticity at room temperature.

They exhibit high adhesion to the conventional chip card materials such as PVC, PC, PET or ABS, for example.

They can be activated at below the softening temperature of the card materials.

Furthermore, chip cards whose modules are bonded in with an adhesive film of the invention feature particularly high flexural strength.

This is demonstrated by conducting a long-term flexural test under a constant load cycle in accordance with DIN EN 20 178.

In the text below, a number of examples illustrate the adhesive film of the invention without wishing to restrict the described invention unnecessarily.

EXAMPLE 1

The following constituents were dissolved in an acetone/methyl ethyl ketone mixture, applied as a solution to a siliconized paper, and then dried.

|  | Trade name |  | % by weight |  |
| --- | --- | --- | --- | --- |
| Thermoplastic PU (TPU) | Desmocoll 400 |  | 55 |  |
| Epoxy resin (Bisphenol A) | Rütapox 0164 |  | 25 |  |
| Dicyandiamide | Dyhard 100 S (SKW Trostberg) |  | 5 |  |
| Silver-coated glass beads | Conductofil 20-60 |  | 15 |  |
| Thickness of the dried adhesive film | $\mu$m |  | 58 | ASTM D 1000 |
| Weight of the adhesive film | g/m$^2$ |  | 55 | ASTM D 1000 |
| Contact resistance | m$\Omega$ |  | 3.5 | ASTM D 2739 |
| Specific resistance | $\Omega$m |  | 0.30 | ASTM D 2739 |
| Bond strength | N/mm$^2$ |  | 10 | DIN EN 1465 |

EXAMPLE 2

The following constituents were dissolved in an acetone/methyl ethyl ketone mixture, applied as a solution to a siliconized paper, and then dried.

| Substance class | | % by weight | |
| --- | --- | --- | --- |
| Nitrile rubber | | 55 | |
| Phenolic resin | | 29.8 | |
| Ageing inhibitor | | 0.2 | |
| Silver-coated glass beads | | 15 | |
| Thickness of the dried adhesive film | $\mu$m | 59 | ASTM D 1000 |
| Weight of the adhesive film | g/m$^2$ | 55 | ASTM D 1000 |
| Contact resistance | m$\Omega$ | 3.5 | ASTM D 2739 |
| Specific resistance | $\Omega$m | 0.32 | ASTM D 2739 |
| Bond strength | N/mm$^2$ | 7.0 | DIN EN 1465 |

What is claimed is:

1. Electrically conductive, thermoplastic and heat-activatable adhesive film, comprising
   i) a thermoplastic polymer In a proportion of from 30 to 89.9% by weigth,
   ii) a) one or more tackifying resins in a proportion of from 5 to 50% by weight or
   b) epoxy resins with hardeners, with or without accelerators, in a proportion of from 5 to 40% by weight, or
   c) both said one or more tackifying resins in a proportion of from 5 to 50% by weight and said epoxy resins with hardeners, with or without accelerators, in a proportion of from 5 to 40% by weight, and
   iii) silver-coated glass beads in a proportion of from 0.1 to 40% by weight,
   iv) where the diameter of the glass beads is at least equal to the thickness of the adhesive film.

2. Adhesive film according to claim 1, wherein the thermoplastic polymer comprises a member selected from the group consisting of thermoplastic polyolefins, polyesters, polyurethanes or polyamides and modified rubbers.

3. The adhesive film of claim 2, wherein said modified rubbers are nitrile rubbers.

4. Adhesive film according to claim 1, wherein the adhesive film is blended with one or more additives.

5. The adhesive film of claim 4, wherein said additives are selected from the group consisting of colorants and mineral or organic fillers.

6. The adhesive film of claim 5, wherein sold additives are selected from the group consisting of silica, carbon powders, and metal powder.

7. Thermoplastic adhesive film according to claim 1, wherein the adhesive film has a thickness of from 20to 500 $\mu$m.

8. Thermoplastic adhesive film according to claim 1, wherein the adhesive film is not pressable at temperatures below 120° C.

9. The adhesive film of claim 8, wherein said temperatures are from 80° C. to 100° C.

10. Thermoplastic adhesive film comprising
    i) a thermoplastic polymer in a proportion of from 30 to 89.9% by weight,
    ii) a) one or more tackifying resins in o proportion of from 5 to 50% by weight or
    b) epoxy resins with hardeners, with or without accelerators, in a proportion of from 5 to 40% by weight, or
    c) both said one or more tackifying resins in a proportion of from 5 to 50% by weight and said epoxy resins with hardeners, with or without accelerators, in a proportion of from 5 to 40% by weight, and
    iii) silver-coated glass beads In a proportion of from 0.1 to 40% by weight,
    iv) where the diameter of the glass beads is at least equal to the thickness of the adhesive film, and
    wherein the adhesive film is in the form of a punched film section.

11. A method for Implanting electrical modules in a card body provided with a cutout for accommodating an electronic module which on a first side has a plurality of contact surfaces and on a second side, which is opposite the first side, has an IC chip whose terminals are connected via electrical conductors to the contact surfaces, wherein an electrically conductive, thermoplastic and heat-activatable adhesive film, comprising
    i) a thermoplastic polymer in a proportion of from 30 to 89.9% by weight,
    ii) a) one or more tackifying resins in a proportion of from 5 to 50% by weight or b) epoxy resins with hardeners, with or without accelerators, in a proportion of from 5 to 40% by weight, or c) both said one or more tackifying resins in a proportion of from 5 to 50% by weight and said epoxy resins with hardeners, with or without accelerators, in a proportion of from 6 to 40% by weight, and iii) silver-coated gloss beads In a proportion of from 0.1 to 40% by weight, iv) where the diameter of the glass beads is at least equal to the thickness of the adhesive film is used to connect the second side of the module to the card body.

* * * * *

UNITED STATES PATENT AND TRADEMARK OFFICE
CERTIFICATE OF CORRECTION

PATENT NO. : 6,861,138 B1
APPLICATION NO. : 09/720947
DATED : March 1, 2005
INVENTOR(S) : Pfaff et al.

It is certified that error appears in the above-identified patent and that said Letters Patent is hereby corrected as shown below:

Column 2, Line 25, "invention," should read -- invention. --

Column 5, Line 61, "polymer In a" should read -- polymer in a --

Column 5, Line 62, "by weigth," should read -- by weight, --

Column 6, Line 23, "wherein sold additives" should read -- wherein said additives --

Column 6, Line 27, "20to" should read -- 20 to --

Column 6, Line 30, "is not pressable" should read -- is hot pressable --

Column 6, Line 38, "in o proportion" should read -- in a proportion --

Column 6, Line 48, "In a proportion" should read -- in a proportion --

Column 6, Line 55, "for Implanting" should read -- for implanting --

Column 7, Line 7, "from 6 to 40%" should read -- from 5 to 40% --

Column 8, Line 1, "gloss beads In a" should read -- glass beads in a --

Signed and Sealed this

Eighth Day of April, 2008

JON W. DUDAS
*Director of the United States Patent and Trademark Office*